(12) United States Patent
Na et al.

(10) Patent No.: US 8,669,582 B2
(45) Date of Patent: Mar. 11, 2014

(54) LIGHT EMITTING DIODE (75) Inventors: Min Gyu Na, Seoul (KR); Sung Kyoon Kim, Seoul (KR); Myeong Soo Kim, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 13/354,138

(22) Filed: Jan. 19, 2012

(65) Prior Publication Data
US 2012/0113673 A1 May 10, 2012

(30) Foreign Application Priority Data

Jan. 27, 2011 (KR) ........................ 10-2011-0008200

(51) Int. Cl.
*H01L 33/00* (2010.01)
(52) U.S. Cl.
USPC .............................. 257/99; 438/621; 438/666
(58) Field of Classification Search
USPC ...................... 257/79–103; 438/618, 621, 666
See application file for complete search history.

(56) References Cited

U.S. PATENT DOCUMENTS

| | | | |
|---|---|---|---|
| 5,696,389 A | 12/1997 | Ishikawa et al. | |
| 6,614,056 B1 * | 9/2003 | Tarsa et al. ...................... | 257/91 |
| 7,829,909 B2 * | 11/2010 | Yoo ................................. | 257/99 |
| 7,842,963 B2 * | 11/2010 | Schiaffino et al. ............... | 257/99 |
| 2005/0056855 A1 * | 3/2005 | Lin et al. .......................... | 257/98 |
| 2009/0146165 A1 * | 6/2009 | Hasnain et al. .................. | 257/98 |
| 2009/0283787 A1 | 11/2009 | Donofrio | |
| 2010/0073590 A1 * | 3/2010 | Lee ................................. | 349/58 |
| 2012/0049154 A1 * | 3/2012 | Schubert ......................... | 257/13 |

FOREIGN PATENT DOCUMENTS

| | | |
|---|---|---|
| DE | 10 2009 006 177 A1 | 6/2010 |
| EP | 2 405 491 A2 | 1/2012 |

* cited by examiner

*Primary Examiner* — Fernando L Toledo
*Assistant Examiner* — Bryan Junge
(74) *Attorney, Agent, or Firm* — Birch, Stewart, Kolasch & Birch, LLP (57) ABSTRACT Disclosed is a light emitting device a light transmissive substrate, a light emitting structure disposed on the light transmissive substrate, comprising a first conductive type semiconductor layer, an active layer and a second conductive type semiconductor layer, a conductive layer disposed on the second conductive type semiconductor layer, a first electrode part disposed on the conductive layer, with at least predetermined region in contact with the first conductive type semiconductor layer, passing through the conductive layer, the second conductive type semiconductor layer and the active, and a first insulation layer disposed between the conductive layer and the first electrode part, between the second conductive type semiconductor layer and the first electrode part and between the active layer and the first electrode part.

12 Claims, 6 Drawing Sheets

LIGHT EMITTING DIODE

CROSS-REFERENCE TO RELATED APPLICATION

This application claims priority under 35 U.S.C. §119 from Korean Application No. 10-2011-0008200 filed in Korea on Jan. 27, 2011, the subject matter of which is hereby incorporated in its entirety by reference as if fully set forth herein.

TECHNICAL FIELD

Embodiments relate to a light emitting device and a light emitting device package.

BACKGROUND

A light emitting diode (LED) is a type of semiconductor that is used as a light source or for sending and receiving a signal after converting electricity into an infrared ray or light, using the property of compound semiconductor.

A III-V group nitride semiconductor has been taking center stage as a core material of a light emitting device such as a light emitting diode (LED) or a laser diode, because of physical and chemical properties.

The light emitting diode (LED) has good eco-friendliness, because it includes no harmful substances hazardous to the environment such as mercury (Hg) used for a conventional lighting system including an incandescent lamp or a fluorescent lamp. Thus, the light emitting diodes (LED) have been substituting for conventional lighting sources, because they have advantages of long life span of use and low power consumption properties.

SUMMARY

Accordingly, the embodiments may provide a light emitting device that can enhance the luminous efficiency and luminous intensity.

In one embodiment, a light emitting device includes a light transmissive substrate; a light emitting structure disposed on the light transmissive substrate, comprising a first conductive type semiconductor layer, an active layer and a second conductive type semiconductor layer; a conductive layer disposed on the second conductive type semiconductor layer; a first electrode part disposed on the conductive layer, with at least predetermined region in contact with the first conductive type semiconductor layer, passing through the conductive layer, the second conductive type semiconductor layer and the active; and a first insulation layer disposed between the conductive layer and the first electrode part, between the second conductive type semiconductor layer and the first electrode part and between the active layer and the first electrode part. The light emitting device may further include a second electrode part disposed on the conductive layer.

The first electrode part may include a first pad part disposed on the first insulation layer; a first expanded part disposed on the first insulation layer, with being expanded from the first pad part; at least one first contact electrode connected to the first expanded part, in contact with the first conductive type semiconductor layer, passing through the conductive layer, the second conductive type semiconductor layer and the active layer.

A plurality of first contact electrodes may be provided and the plurality of the first contact electrodes may be spaced apart from each other. The distances between each two neighboring ones of the first contact electrodes may be uniform. The distances between two neighboring ones of the first contact electrodes may be increasing as they are getting more distant from the first pad part.

In another embodiment, a light emitting device includes a substrate; a light emitting structure disposed on the substrate, comprising a first conductive type semiconductor layer, an active layer and a second conductive type semiconductor layer; a conductive layer disposed on the second conductive type semiconductor layer; a first electrode part disposed on the conductive layer, with at least predetermined region in contact with the first conductive type semiconductor layer, passing through the conductive layer, the second conductive type semiconductor layer and the active layer; a first insulation layer disposed between the conductive layer and the first electrode part, between the second conductive type semiconductor layer and the first electrode part and between the active layer and the first electrode part; a second electrode part disposed on the conductive layer; and a second insulation layer disposed between the conductive layer and the second electrode part, wherein at least predetermined region of the second electrode part is in contact with the conductive layer, passing through the second insulation layer.

The first electrode part may include a first pad part disposed on the first insulation layer; a first expanded part disposed on the first insulation layer, with being expanded from the first pad part; and at least one first contact electrode connected to the first expanded part, in contact with the first conductive type semiconductor layer, passing through the conductive layer, the second conductive type semiconductor layer and the active layer.

The second electrode part may include a second pad part disposed on the second insulation layer; a second expanded part disposed on the second insulation layer, with being expanded from the second pad part; and at least one second contact electrode connected to the second expanded part, in contact with the conductive layer, passing through the second insulation layer.

A plurality of first contact electrodes may be provided and the plurality of the first contact electrodes may be spaced apart from each other. The distances between each two neighboring ones of the first contact electrodes may be uniform. The distances between two neighboring ones of the first contact electrodes may be increasing as they are getting more distant from the first pad part.

The light emitting device may further include a current blocking layer disposed between the second conductive type semiconductor layer and the conductive layer, with at least predetermined region overlapped with the second electrode part. A plurality of second contact electrodes may be provided and the plurality of the second contact electrodes may be spaced apart a predetermined distance from each other. The distances between each two neighboring ones of the second contact electrodes may be uniform. The distances between two neighboring ones of the second contact electrodes may be increasing as they are getting more distant from the second pad part. The first contact electrode may be aligned between two neighboring ones of the second contact electrodes. A center of the first contact electrode may be aligned at a middle point between two neighboring ones of the second contact electrodes. The second contact electrodes connected to the first branched finger electrode and the second contact electrodes connected to the second branched finger electrode may be disposed symmetrically.

In a further embodiment, a backlight unit includes a bottom cover; a reflecting plate disposed on the bottom cover; a light source module comprising at least one light emitting device; a light guide plate disposed in front of the reflecting plate, to guide light emitted from the light source module; an optical sheet disposed in front of the light guide plate; and a display panel disposed in front of the optical sheet. The light emitting device may be the light emitting device according to the embodiments mentioned above.

The light emitting device according to the embodiments may enhance luminous efficiency and luminous intensity.

BRIEF DESCRIPTION OF THE DRAWINGS

Arrangements and embodiments may be described in detail with reference to the following drawings in which like reference numerals refer to like elements and wherein.

DETAILED DESCRIPTION

Hereinafter, embodiments will be described with reference to the annexed drawings. It will be understood that when an element is referred to as being 'on' or 'under' another element, it can be directly on/under the element, and one or more intervening elements may also be present. When an element is referred to as being 'on' or 'under', 'under the element' as well as 'on the element' can be included based on the element.

The size of each element is exaggerative, omitted or illustrative schematically. Also, the size of each element may not reflect the substantial size necessarily. The same reference numbers will be used throughout the drawings to refer to the same or like parts. Hereinafter, embodiments will be described with reference to the annexed drawings.

Figure 1:
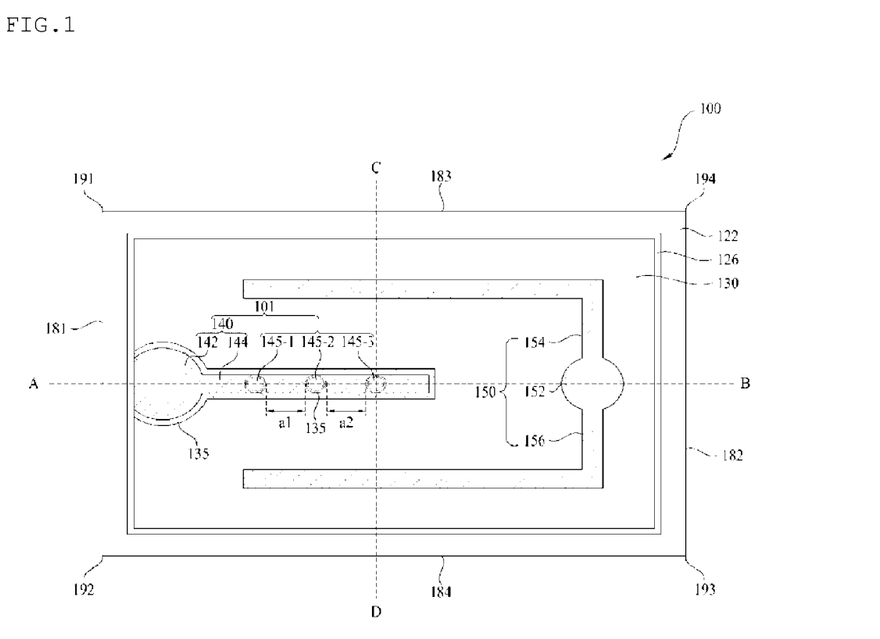
FIG. 1 is a plane view illustrating a light emitting device according to a first embodiment.
Figure 2:
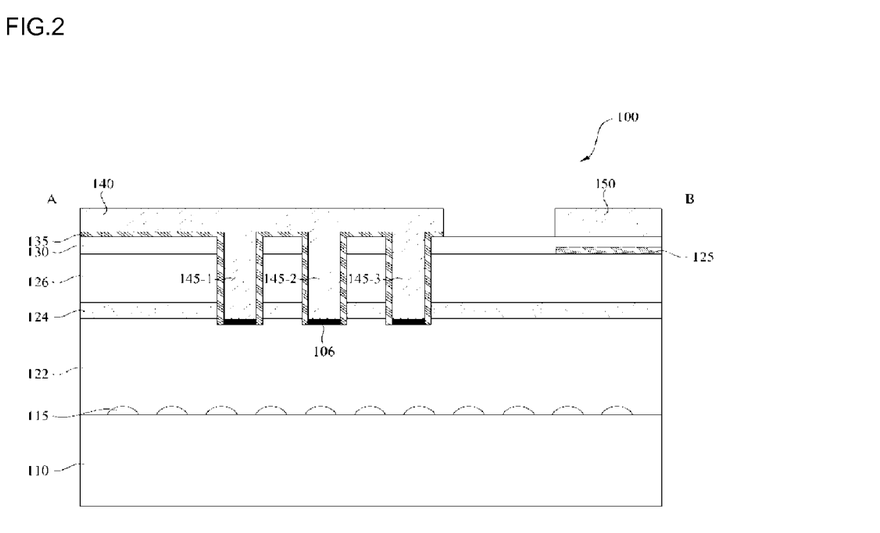
FIG. 2 is a sectional view illustrating the light emitting device shown in FIG. 1, along an AB direction.

FIG. 1 is a plane view illustrating a light emitting device 100 according to a first embodiment. FIG. 2 is a sectional view illustrating the light emitting device 100 shown in FIG. 1, along an AB direction and FIG. 3 is a sectional view illustrating the light emitting device 100 shown in FIG. 1, along a CD direction.

Figure 3:
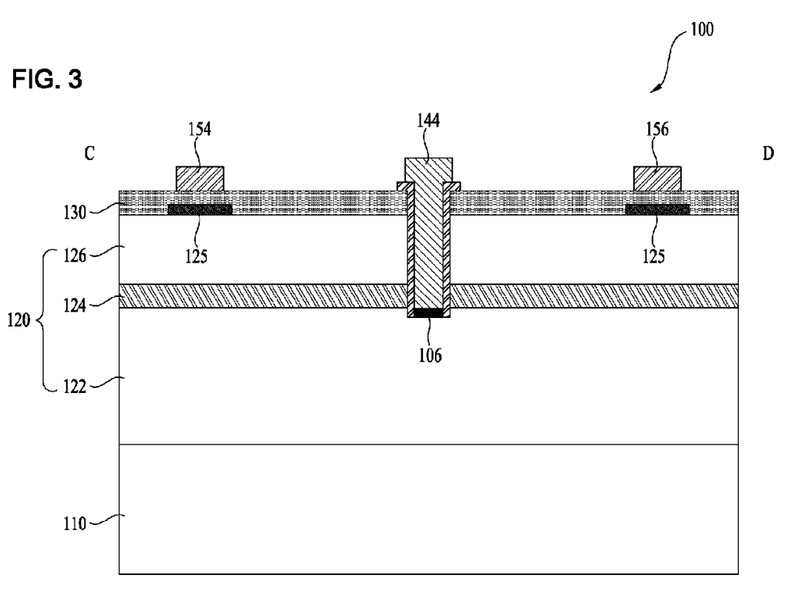
FIG. 3 is a sectional view illustrating the light emitting device shown in FIG. 1, along a CD direction.

In reference to FIGS. 1 to 3, the light emitting device 100 may include a substrate 110, a light emitting structure 120, a current blocking layer 125, a conductive layer 130, a first insulation layer 135, at least one first contact electrode 145-1 to 145-3, a first electrode 140 and a second electrode 150. Here, the first contact electrode 145-1 to 145-3 and the first electrode 140 may compose a first electrode part 101.

The substrate 110 may be a light transmissive substrate and it may be selected from a group consisting of a sapphire substrate ($Al_2O_3$), GaN, SiC, ZnO, Si, GaP, InP, $Ga_2O_3$, a conductive substrate and GaAs. An unevenness pattern 115 may be formed on a top surface of the substrate 110 to enhance light extraction efficiency.

The light emitting structure 120 may include a first conductive type semiconductor layer 122, an active layer 124 and a second conductive type semiconductor 126, which are multilayered on the substrate sequentially. At this time, the first conductive type may be 'n'-type and the second conductive type may be 'p'-type, and the embodiment may not be limited thereto.

Between the substrate 110 and the light emitting structure 120 may be formed a layer or pattern using II-VI group compound semiconductors, for example, at least one of a ZnO layer (not shown), a buffer layer (not shown) and a undoped semiconductor layer (not shown). The buffer layer or the undoped semiconductor layer may be formed of III-V group compound semiconductors. The buffer layer may reduce difference of lattice constants with respect to the substrate 110 and the undoped semiconductor layer may be formed of an undoped GaN-based semiconductor.

The first conductive type semiconductor 122 may be a nitride-based semiconductor layer, for example, a layer formed of a selected one from InAlGaN, GaN, AlGaN, InGaN, AlN, InN and AlInN, with an n-dopant (for example, Si, Ge and Sn) doped there.

The active layer 124 may be formed of III-V group compound semiconductors in a single or multi quantum well structure, a quantum-wire structure or a quantum dot structure.

When it is formed in the quantum well structure, the active layer 124 may have the single or multi quantum well structure including a well layer having an empirical formula of $In_xAl_yGa_{1-x-y}N$ ($0 \leq x \leq 1$, $0 \leq y \leq 1$, $0 \leq x+y \leq 1$) and a barrier layer having an empirical formula of $In_aAl_bGa_{1-a-b}$ ($0 \leq a \leq 1$, $0 \leq b \leq 1$, $0 \leq a+b \leq 1$). The well layer may be formed of a material with a band gap that is lower than a band gap of the barrier layer.

The second conductive type semiconductor layer 126 may be a nitride-based semiconductor layer, for example, a layer formed of a selected material from InAlGaN, GaN, AlGaN, InGaN, AlN, InN and AlInN, with a p-dopant (for example, Mg, Zn, Ca, Sr and Ba) doped thereon.

The current blocking layer 125 may be disposed on a predetermined region of the second conductive type semiconductor layer 126 to prevent currents concentrated on only a point of the light emitting structure 120. The current blocking layer 125 may be formed of an insulative material such as an oxide layer for the current blocking. For example, the current blocking layer 125 may be formed of at least one of $SiO_2$, $SiN_x$, $TiO_2$, $Ta_2O_3$, SiON and SiCN.

The current blocking layer 125 may be overlapped with the second electrode 150 which will be described in detail later. In other words, the current blocking layer 125 may be disposed on the second conductive type semiconductor layer 126, corresponding to the second electrode 150.

The conductive layer 130 may be disposed on the second conductive type semiconductor layer 126. At this time, the conductive layer 130 may cover the current blocking layer 125 disposed on the second conductive type semiconductor layer 126. The conductive layer 130 may be employed to enhance light extraction efficiency. The conductive layer 130 may be formed of a transparent oxide-based material with a high transmissivity with respect to a luminescence wavelength, for example, indium tin oxide (ITO), tin oxide (TO), indium zinc oxide (IZO), indium tin oxide (ITZO) and zinc oxide (ZnO).

The first electrode part 101 may be disposed on the conductive layer 130 and at least a predetermined region of the first electrode part 101 may be in contact with the first conductive type semiconductor layer 122, passing through the conductive layer 130, the second conductive type semiconductor layer 126 and the active layer.

The first electrode part 101 may include a first electrode 140 and at least one first contact electrode 145-1 to 145-3. The first electrode 140 may have a first pad part 142 and a first expanded part 144.

The at least one first contact electrode 145-1 to 145-3 may be in contact with the first conductive type semiconductor layer 122, passing through the conductive layer 130, the second conductive type semiconductor layer 126 and the active layer. For example, an end of the at least one first contact electrode 145-1 to 145-3 may be in contact with the first conductive type semiconductor layer 122 and the other end thereof may be open from the conductive layer 130.

The at least one first contact electrode 145-1 to 145-3 may be formed of a conductive material, for example, at least one of Ti, Al, Al alloy, In, Ta, Pd, Co, Ni, Si, Ge, Ag, Al alloy, Au, Hf, Pt, Ru and Au or alloy of them, in a single or multi layer structure.

At this time, an ohmic layer 106 may be insertedly disposed between the at least one first contact electrode 145-1 to 145-3 and the first conductive type semiconductor layer 122. For example, the ohmic layer 106 may be a material ohmic-contacting with the first conductive type semiconductor layer 122 and it may be formed of an conductive oxide layer including ITO, Ni, Cr, Ti, Al, Pt and Pd.

The first electrode 140 may be disposed on a predetermined region of the first contact electrode 145-1 to 145-3 and the conductive layer 130, to be connected with the first contact electrode 145-1 to 145-3. The first insulation layer 135 may be disposed between the first electrode 140 and the conductive layer 130, to prevent electrical contact between the first electrode 140 and the conductive layer 130.

The first electrode 140 may include the first pad part 142 disposed on a predetermined region of the conductive layer 130 and a first expanded part 144 expanded from the first pad part 142.

At this time, the first pad part 142 may be a part of the first electrode where the first pad is disposed. The first expanded part 144 may be another part branched from the first pad part to be in electrical contact with the at least one first contact electrode 145-1 to 145-3. For example, the first pad part 142 may be a region where a wire is bonded to be supplied a first electric power from outside.

The first expanded part 144 may be expanded along a first direction after branched from the first pad part 142, to be in contact with the at least one first contact electrode 145-1 to 145-3. The light emitting structure 120 may have four corners 191 to 194 and the first direction may be from a first corner 191 toward a fourth corner 194.

The first pad part 142 and the first expanded part 144 may be formed of the same material and they may be integrally formed with each other. The first expanded part 144 shown in FIG. 1 may be configured of a branched finger electrode branched toward the first pad part 142. This embodiment may not be limited thereto and the first expanded part 144 may have two or more branched finger electrodes.

The width of the first expanded part 144 may be 5.0 um~20 um. The width (W2) (or the diameter) of the first contact electrode 145-1 to 145-3 may be the same as or larger than the width (W1) of the first expanded part 144. For example, the ratio of the width (W1) of the first expanded part 144 to the width (W2) of the first contact electrode (W2/W1) may be 1~1.5.

FIG. 1 illustrates three first contact electrodes and the first embodiment may not be limited thereto. At this time, the three first contact electrodes 145-1 to 145-3 may be spaced apart from the first pad part 142 and each of the first contact electrodes 145-1 to 145-3 may be spaced apart from each other.

The distance (for example, a1 and a2) between each two neighboring first contact electrodes (for example, between 145-1 and 145-2 and between 145-2 and 145-3) may be uniformly formed (a1=a2).

However, the first embodiment may not be limited thereto. According to another embodiment, the distances between two neighboring first contact electrodes (for example, between 145-1 and 145-2 and between 145-2 and 145-3) may be different from each other (a1≠a2). For example, the distance between two neighboring first contact electrodes (between 145-1 and 145-2 and between 145-2 and 145-3) may be larger (a1>a2), as they are closer to the first pad part 142. The closer to the first pad part 142 is a region of the light emitting device is, the more currents may be crowded. Because of that, the distance (a1) between the neighboring two of the first contact electrodes 145-1 and 145-2 located relatively closer to the first pad part 142 may be relatively large and the distance (a2) between the other two 145-2 and 145-3 located relatively distant from the first pad part 142 may be relatively small, to reduce the current crowding. The currents may be dispersed far from the first pad part and uniform luminescence distribution may be gained. Such uniform luminescence distribution may result in enhancement of luminescence efficiency. For example, the first distance (a1) between neighboring two of the first contact electrodes 145-1 and 145-2 may be larger than the distance (a2) between the other two 145-2 and 145-3. At this time, the space for the first distance (a1) may be closer to the first pad part 142 than the space for the first distance (a2).

The at least one first contact electrode 145-1 to 145-3 may be formed in a plug shape having a through-hole filled with a conductive material and a sectional shape thereof may be circular, oval, triangular, rectangular and pentagonal and the like. For example, when the cross section of the first contact electrode 145-1 to 145-3 is rectangular, the ratio of a horizontal line to a vertical line may be 1~10 and the embodiment may not be limited thereto.

The at least one first contact electrode 145-1 to 145-3 and the first electrode 140 may be formed of the same material and they may be integrally formed with each other. For example, the first expanded part 144 may have at least one first contact electrode 145-1 to 145-3 branched via the conductive layer 130, the second conductive type semiconductor layer 126 and the active layer, to be in contact with the first conductive type semiconductor layer 122. According to the first embodiment, three first contact electrodes 145-1 to 145-3 spaced apart a predetermined distance from each other, branched from the first expanded part 144, and the number according to the embodiment may not be limited thereto.

The first insulation layer 135 may be disposed between the at least one first contact electrode 145-1 to 145-3 and the conductive layer 130, the second conductive type semiconductor layer 126 and the active layer, to electrically insulate the at least one first contact electrode 145-1 to 145-3 from the conductive layer 130, the second conductive type semiconductor layer 126 and the active layer 124.

For example, the first insulation layer 135 may be disposed between a region passing through the conductive layer 130, the second conductive type semiconductor layer 126 and the active layer 124 and lateral surfaces of the first contact electrodes 145-1 to 145-3.

The first insulation layer 135 may be disposed between the first electrode 140 and the conductive layer 130 to electrically insulate the first electrode 140 from each other. For example, the first insulation layer 135 may be disposed between the first pad part 142 and the conductive layer 130, and the first insulation layer 135 may be disposed between the conductive layer 130 and the other region of the expanded part 144 expect the region in contact with the first contact electrodes 145-1 to 145-3. The thickness of the first insulation layer 135 may be 10 nm~1000 nm.

The first insulation layer 135 may be formed of an insulation material, for example, $SiO_2$, SiN, $SiO_x$, $SiO_xN_y$, $Si_3N_4$ and $Al_2O_3$. In addition, the first insulation layer 135 may be realized by Schottky contact provided between the conductive layer 130 and the first electrode 140. At this time, the first electrode 140 in Schottky contact with the conductive layer 130 may be deposited or the first electrode 140 may be deposited after the conductive layer 130 is plasma-treated, to form Schottky contact between the conductive layer 130 and the first electrode 140.

The second electrode 150 may be disposed on another region of the conductive layer 130. The second electrode 150 may include a second pad part 152 and a second expanded part 154 and 156. The second pad part 152 may be a part of the second electrode where a second pad is disposed. For example, the second pad part 152 may be a region where a wire is bonded to receive a second electric power from the outside.

The second expanded part 154 and 156 may be a part of the second electrode 165 branched from the second pad part 152. For example, the second expanded part 154 and 156 may include a first branched finger electrode 154 and a second branched finger electrode 156 which are branched from the second pad part 152. The first branched finger electrode 154 may be branched from a predetermined side of the second pad part 152 and the second branched finger electrode 154 may be branched from the other opposite side of the second pad part 152.

For example, the first branched finger electrode 154 may be branched along a third direction after branched from the predetermined side of the second pad part 152 along a second direction. The second branched finger electrode 156 may be branched along a third direction after branched from the other opposite side of the second pad part 152 along a fourth direction.

Here, the second direction may be from a third corner 193 toward a fourth corner of the light emitting structure 120. The fourth direction may be from the fourth corner 194 toward the third corner 193. In other words, the second direction is the reverse of the second direction. The third direction may be from the fourth corner 194 toward the third corner 191 of the light emitting device 100. In other words, the third direction may be the reverse of the first direction.

However, the embodiment is not limited thereto and the first branched finger electrode 154 and the second branched finger electrode 156 may be variable.

The current blocking layer 125 may be disposed between the second conductive type semiconductor layer 126 and the conductive layer 130, to be overlapped with the second pad part 152, the first branched finger electrode 154 and the second branched finger electrode 156.

The first pad part 142 may be disposed on the region of the conductive layer 130 adjacent to a first lateral surface 181 between the first corner 191 and the second corner 192 of the light emitting structure 120. The second pad part 152 may be disposed on the region of the conductive layer 130 adjacent to a second lateral surface 182 between the third corner 193 and the fourth corner 194.

The first pad part 142 may be aligned at a center of the first lateral surface 181 and the second pad part 152 may be aligned at a center of the second lateral surface 182. An end of the first expanded part 144 may be spaced apart a predetermined distance from the second pad part 152 and the first expanded part 144 may be branched from the first pad part 142 along the first direction to be aligned on the second pad part 152.

The first branched finger electrode 154 may be disposed adjacent to the second lateral surface 182 and the third lateral surface 183 between the first corner 191 and the fourth corner 194. The second branched finger electrode 156 may be disposed adjacent to the second lateral surface 182 and a fourth lateral surface 184 between the second corner 192 and the third corner 193.

The first expanded part 144 may be located between the first branched finger electrode 154 and the second branched finger electrode 156. The first expanded part 144 may be partially overlapped with the first branched finger electrode 154 along the second direction and the second branched finger electrode 156 along the third direction.

In the conventional light emitting device, the light emitting structure may be MESA-etched, corresponding to an n-electrode. However, in the light emitting device 100 according to the first embodiment, only the conductive layer 130 where the at least one first contact electrode 145-1 to 145-3 may be disposed in contact with the first conductive type semiconductor layer 122 may have the passing-through structure. Because of that, an effective luminous area of the light emitting device 100 may be relatively increased and the luminescence intensity may be enhanced. Also, the driving currents required to gain the desired luminescence intensity may be reduced, because the luminous area is increased.

Also, according to the first embodiment, the conductive layer 130 may be disposed not only under the first pad part 142 but also under the first expanded part 144, except the first contact electrode 145-1 to 145-3. Because of that, the region where the conductive layer 130 is disposed may be increased and a region where holes are provided may be enlarged. As a result, the luminous area may be increased.

Figure 4:
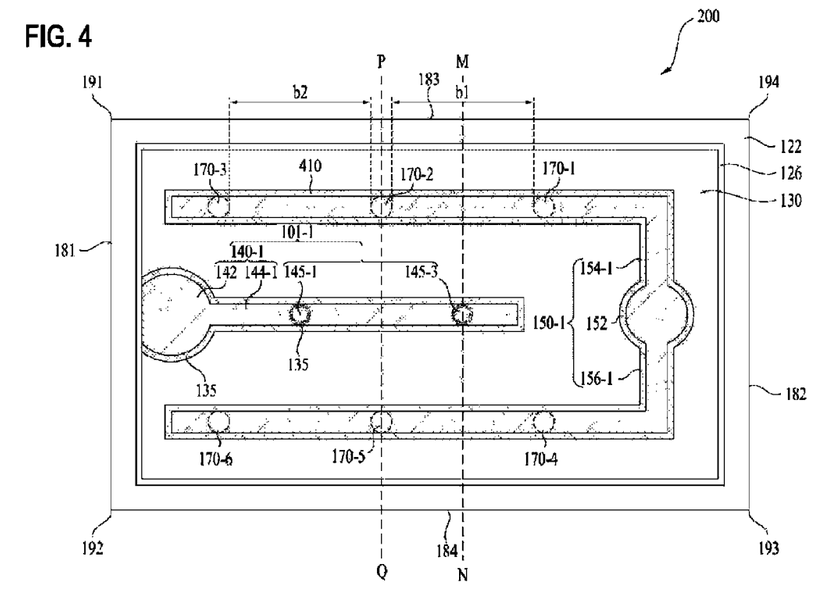
FIG. 4 is a light emitting device according to a second embodiment.
Figure 5:
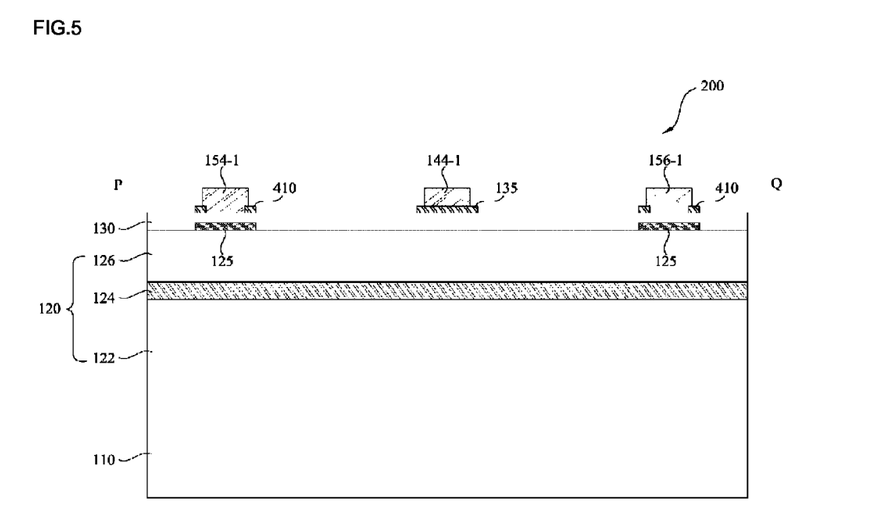
FIG. 5 is a sectional view illustrating the light emitting device shown in FIG. 1, along a PQ direction.
Figure 6:
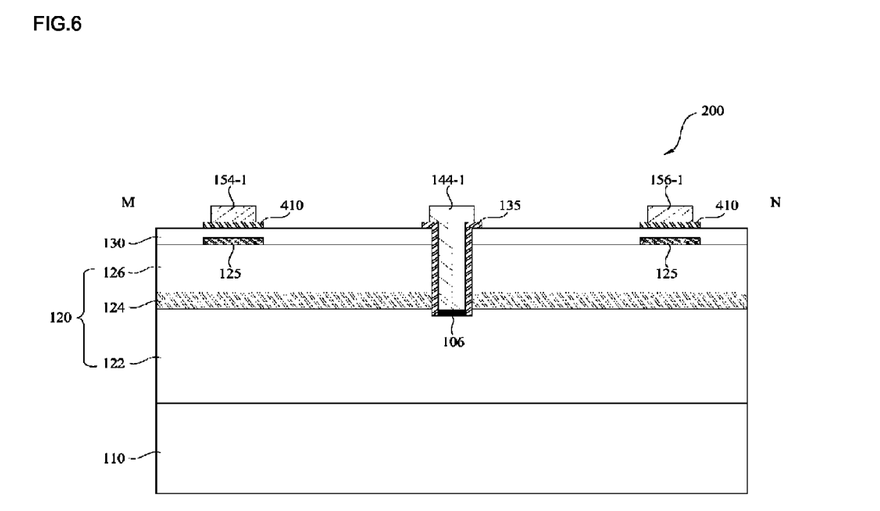
FIG. 6 is a sectional view illustrating the light emitting device shown in FIG. 1, along a MN direction.

FIG. 4 illustrates a light emitting device 200 according to a second embodiment. FIG. 5 is a sectional view illustrating the light emitting device 200 shown in FIG. 1, along PQ direction. FIG. 6 is a sectional view illustrating the light emitting device 200 shown in FIG. 1, along MN direction. The identical elements to the elements of the embodiment shown in FIG. 1 will have the same numeral references and repeated description thereof will be omitted accordingly.

In reference to FIGS. 4 to 6, the light emitting device 200 may include a substrate 110, a light emitting structure 120, a current blocking layer 125, a conductive layer 130, a first insulation layer 135, a first electrode part 101-1, a second electrode part 140-1 and 170-1 to 170-6 and a second insulation layer 410.

In reference to FIGS. 4 to 6, the conductive layer 130 may be disposed on the second conductive type semiconductor layer 126 where the current blocking layer 125 is disposed.

The first electrode part 101-1 may include a first electrode 140-1 and at least one first contact electrode 145-1 and 145-3. The first electrode 140-1 may include a first pad part 142 and a first expanded part 144-1. The first electrode 140-1 of the second embodiment may include two first contact electrodes 145-1 and 145-3 which are spaced apart a predetermined distance from each other, and this embodiment may not be limited thereto. Two or more first contact electrodes may be provided. The first electrode 140-1 according to the second embodiment may be the same as the first electrode 140 according to the first embodiment, except the number of the first contact electrodes.

The second electrode part 150-1 and 170-1 to 170-6 may be disposed on another region of the conductive layer 130. The second insulation layer 410 may be disposed between the second electrode part 150-1 and 170-1 to 170-6 and the conductive layer 130. At least a predetermined region of the second electrode part 150-1 and 170-1 to 170-6 may be in contact with the conductive layer 130, passing through the second insulation layer 410.

The second electrode part 150-1 and 170-1 to 170-6 may include a second electrode 150-1 and at least one second contact electrode 170-1 to 170-6. In the embodiment shown in FIG. 4, a plurality of second contact electrodes 170-1 to 170-6 and the embodiment is not limited thereto.

The second electrode 150-1 may include a second pad part 152 and a second expanded part 154-1 and 156-1. The second pad part 152 may be disposed on the second insulation layer 410. The second expanded part 154-1 and 156-1 may be disposed on the second insulation layer 410, expanded from the second pad part 152. The second expanded part 154-1 and 156-1 may include a first branched finger electrode 154-1 and a second branched finger electrode 156-1. At this time, the first branched finger electrode 154-1 and the second branched finger electrode 156-1 may be branched as described in reference to FIG. 1.

The second insulation layer 410 may be disposed between the second electrode 150-1 and the conductive layer 130 and it may insulate the second electrode 150-1 and the conductive layer 130 from each other. For example, the second insulation layer 410 may be disposed between the second pad part 152 and the conductive layer 130 and between the second expanded part 154-1 and 156-1 and the conductive layer 130. The second insulation layer 410 and the first insulation layer 135 may be formed of the same material, integrally formed as a single layer. The thickness of the second insulation layer 410 may be the same as that of the first insulation layer 135.

The second contact electrodes 170-1 to 170-6 may be in contact with the conductive layer 130, through the second insulation layer 410, to be connected with the second expanded part 154-1 and 156-1. The width (or diameter) of the second contact electrode 170-1 to 170-6 may be the same as or larger than the width of the second expanded part 154-1 and 156-1. The second expanded part 154-1 and 156-1 may be connected with the second contact electrodes 170-1 to 170-6. The second insulation layer 410 may be disposed between the second contact electrodes 170-1 to 170-3 and the conductive layer 130, to electrically insulate them (170-1 to 170-3 and 130) from each other.

For example, the second contact electrodes 170-1 to 170-3 may be branched from the first branched finger electrode 154-1, to be in contact with the conductive layer 130 through the second insulation layer 410. At this time, the second contact electrodes 170-1 to 170-3 may be disposed, spaced apart a predetermined distance from each other.

The distances between each two neighboring ones of the second contact electrodes (for example, between 170-1 and 170-2 and between 170-2 and 170-3) may be uniform (b1=b2).

However, this embodiment may not be limited thereto. According to another embodiment, the distances between each two neighboring ones of the second contact electrodes (for example, between 170-1 and 170-2 and between 170-2 and 170-3) may be different from each other (b1≠b2).

For example, as they are closer to the second pad part 152, the distances between two neighboring ones of the second contact electrodes (between 170-1 and 170-2 and between 170-2 and 170-3) may be getting larger (b1>b2). For example, the distance (b1) between two neighboring ones of the second contact electrodes (between 170-1 and 170-2) may be larger than the distance (b2) between the other two neighboring ones (between 170-2 and 170-3) (b1>b2). The reason why the distances between two neighboring two of the second contact electrodes 170-1 to 170-6 are different from each other is to reduce current crowding which might be generated by the currents crowded more in a region of the light emitting device 100 closer to the second pad part 152.

The second contact electrodes 170-4 to 170-6 may be branched from the second branched finger electrode 156-1, to be in contact with the conductive layer 130 through the second insulation layer 410. At this time, the second contact electrodes 170-4 to 170-6 may be spaced apart a predetermined distance from each other.

The distances between each two neighboring ones of the second contact electrodes (for example, between 170-4 and 170-5 and between 170-5 and 170-6) may be uniform. However, the embodiment may not be limited thereto. According to another embodiment, the distances between each two neighboring ones of the second contact electrodes (for example, between 170-4 and 170-5 and between 170-5 and 170-6) may be different from each other. For example, as they are getting closer to the second pad part 152, the distances between two neighboring ones of the second contact electrodes (between 170-4 and 170-5 and between 170-5 and 170-6) may be getting increasing.

Figure 7:
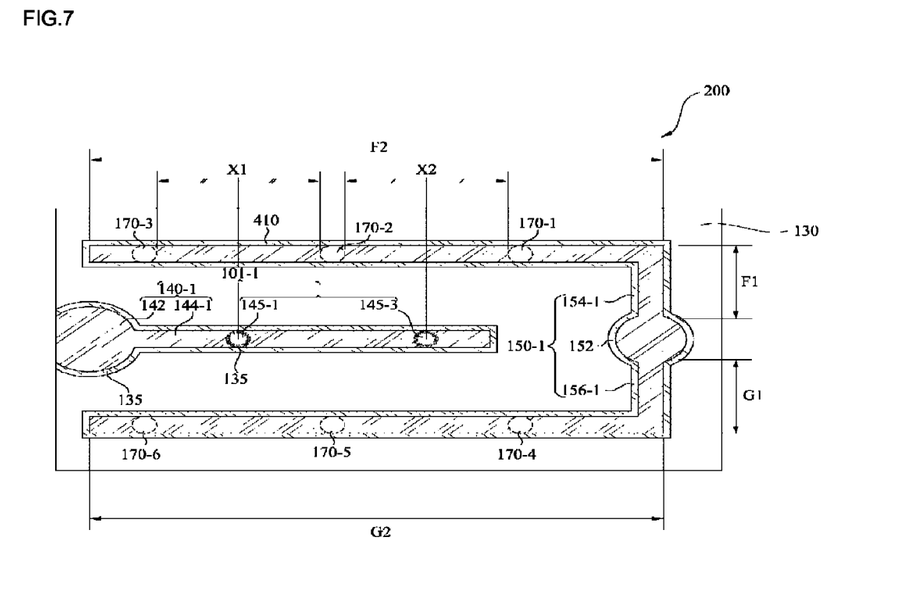
FIG. 7 illustrates disposition according to a first embodiment of first contact electrodes and second electrodes shown in FIG. 1.

FIG. 7 illustrates a first embodiment of the disposition of the first contact electrodes and the second contact electrodes shown in FIG. 4. In reference to FIG. 7, the second contact electrodes 170-1 to 170-3 connected with the first branched finger electrode 154-1 and the second contact electrodes 170-4 to 170-6 connected with the second branched finger electrode 156-1 may be disposed in symmetry. For example, the second contact electrodes 170-1 to 170-3 and the second contact electrodes 170-4 to 170-6 may be aligned with each other along a perpendicular direction with respect to the first direction. For current dispersion, the first contact electrodes 145-1 and 145-3 and the second contact electrodes 170-1 to 170-6 may be non-overlapped with each other along a perpendicular direction with respect to the first direction. In other words, the first contact electrodes 145-1 and 145-3 and the second contact electrodes 170-1 to 170-6 may be non-aligned with each other along a perpendicular direction with respect to the first direction.

The first branched finger electrode 154-1 may include a first portion (F1) branched from a side of the second pad part 152 along the second direction and a second portion (F2) branched from the first portion (F1) along the third direction. Also, the second branched finger electrode 156-1 may include a third portion (g1) branched from the other opposite side of the second pad part 152 along the fourth direction and a fourth portion (G2) branched from the third portion (G1) along the third direction.

The second contact electrodes 170-1 to 170-6 may be provided on the second portion (f2) and the fourth portion (G2), spaced apart a predetermined distance from each other. One of the first contact electrodes 145-1 and 146-3 may be disposed between neighboring two second contact electrodes along a perpendicular direction with respect to the first direction.

The first contact electrode 145-1 may be disposed at a position corresponding to a middle point (X1) between two neighboring second contact electrodes 170-2 and 170-3.

For example, a center of the first contact electrode 145-1 and 146-3 may be disposed at a middle point (X1 and X2) between the two neighboring second contact electrodes.

Figure 8:
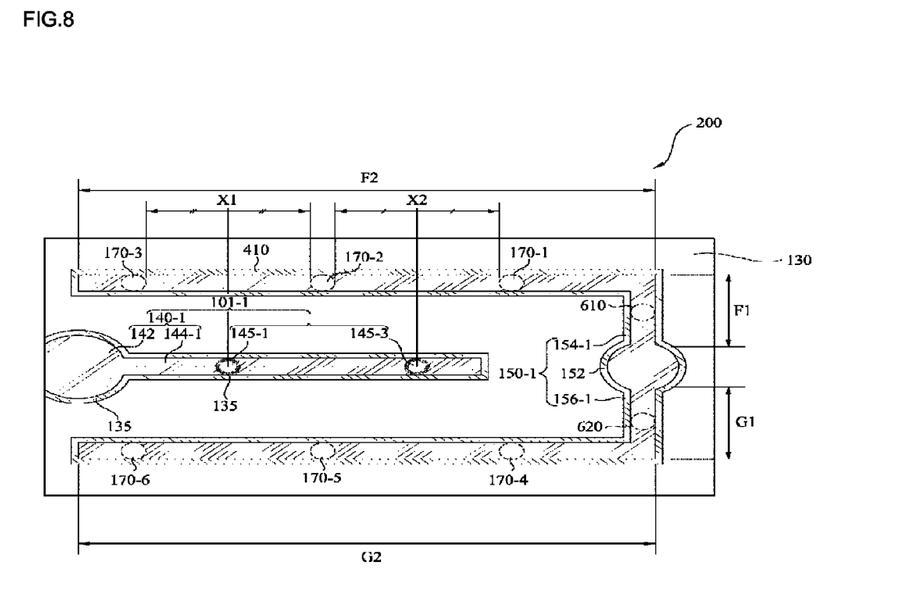
FIG. 8 illustrates disposition according to a second embodiment of first contact electrodes and second electrodes shown in FIG. 4.

FIG. 8 illustrates a second embodiment of the disposition of the first contact electrodes and the second contact electrodes shown in FIG. 4. The identical elements to the embodiment shown in FIG. 7 will have the same numeral references and repeated description will be omitted accordingly.

In reference to FIG. 8, the second contact electrodes 170-1 to 170-6 may be provided on the second portion (F2) of the second branched finger electrode 154-1 and the fourth portion (G2) of the second branched finger electrode 145-1. At least one second contact electrode 610 and 620 may be provided on the first portion (F1) of the first branched finger electrode 154-1 and the third portion (F1) of the second branched finger electrode 156-1.

According to this embodiment, the first contact electrodes 145-1 and 145-3 and the second contact electrodes 170-1 to 170-6 may be disposed, without overlapped with each other along a perpendicular direction with respect to the first direction. Because of that, the distance between an electron supply part and a hole supply part may be increased to disperse currents. As a result, the luminescence efficiency of the light emitting device may be enhanced.

Figure 9:
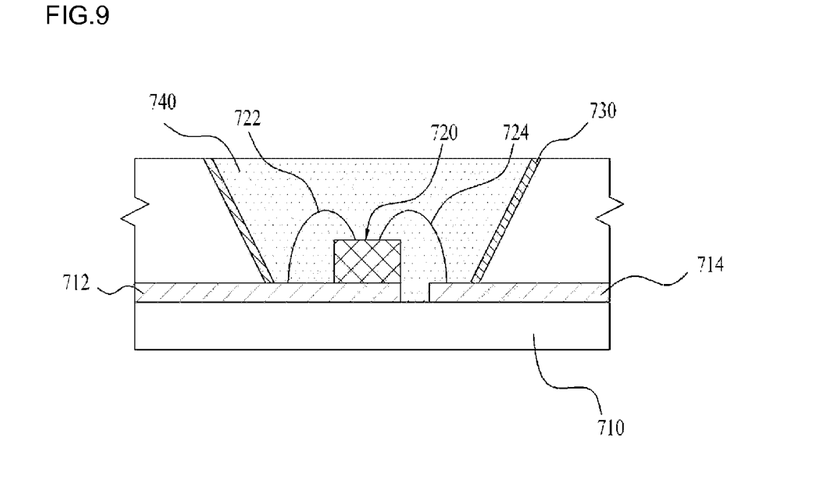
FIG. 9 illustrates a light emitting device package according to an exemplary embodiment.

FIG. 9 illustrates a light emitting device package according to an embodiment. In reference to FIG. 9, a light emitting device package may include a package body 710, a first metal layer 712, a second metal layer 714, a light emitting device 720, a first wire 722, a second wire 724, a reflection plate 730 and a sealing layer 740.

The package body 710 may have a structure having a cavity formed in a predetermined region. A lateral wall of the cavity may be inclined. The package body 710 may be formed of an insulative or heat conductive substrate such as a silicon-based wafer level package, a silicon substrate, a silicon carbide (SiC), aluminum nitride (AlN). The package body 710 may be configured of a plurality of multilayered substrates. This embodiment may not be limited to the material, structure and shape of the package body mentioned above.

Considering heat emission or the mounting process of the light emitting device, the first metal layer 712 and the second metal layer 714 may be electrically separated from each other on a surface of the package body 710. The light emitting device 720 may be electrically connected with the first metal layer 712 and the second metal layer 714 via the first wire 722 and the second wire 724. At this time, the light emitting device 720 may be one of the embodiments described above.

For example, the first wire 722 may electrically connect the second pad part 152 of the light emitting device 100 or 200 shown in FIG. 1 or 4 with the first metal layer 712 and the second wire 724 may electrically connect the first pad part 142 with the second metal layer 714.

The reflection plate 730 may be formed on a lateral wall of the cavity formed in the package body 710 to make the light emitted from the light emitting device 720 directed toward a preset direction. The reflection plate 730 may be formed of a light reflective material, for example, metal coating or a metal piece.

The sealing layer 740 may surround the light emitting device 720 located in the cavity of the package body 710, to protect it from the external environment. The sealing layer 740 may be formed of a colorless transparent polymer resin material such as epoxy or silicon. The sealing layer 740 may include phosphor to change the wavelength of the light emitted from the light emitting device 720. At least one of the light emitting devices according to the embodiments described above the light emitting device package may be mounted on the light emitting device package and this embodiment may not be limited thereto.

The light emitting device package according to the present invention may be arrayed on a substrate. As optical members, a light guide plate, a prism sheet and a diffusion sheet may be disposed on a luminous path of the light emitting device packages. Those light emitting device packages, the substrate and the optical members may be functioned as a light unit.

A further embodiment may be realized by a display device, a pointing device or a lighting system including the semiconductor light emitting device or the light emitting device package according to the embodiments. For example, the lighting system may include a lamp and a streetlamp.

Figure 10:
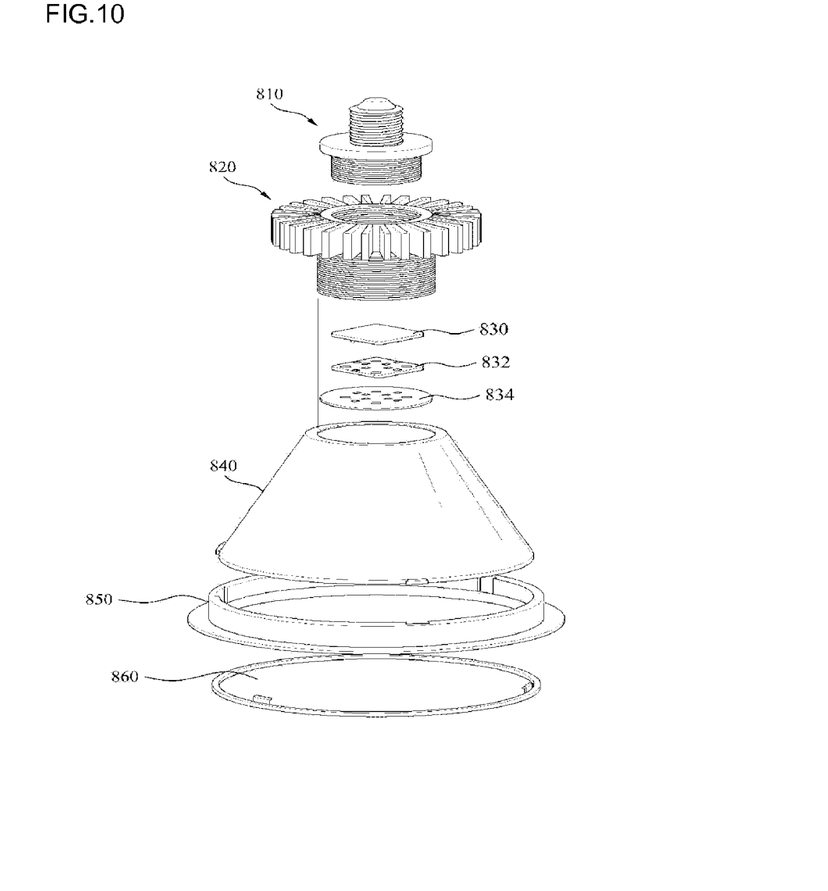
FIG. 10 illustrates a lighting system according to an exemplary embodiment, which includes the light emitting device.

FIG. 10 illustrates a lighting device including the light emitting device according to the embodiment. In reference to FIG. 10, the lighting device may include an electric power coupling part 810, a heat sink 820, a light emitting module 830, a reflector 840, a cover cap 850 and a lens part 860.

The electric power coupling part 810 may have a screw shape, with an upper end inserted in an external electric socket (not shown), and it may supply an electric power to the light emitting module 830 because the upper end of the electric power coupling part 810 is inserted in the external electric socket. The heat sink 820 may emit the heat generated from the light emitting module 830 outside via a heat sink fin formed in a lateral surface thereof. An upper end of the heat sink 820 may be screw-coupled to a lower end of the electric power coupling part 810.

The light emitting module 840 may be fixed to a bottom surface of the heat sink 820, with the light emitting device packages mounted on a circuit board. At this time, the light emitting device packages may be the ones according to the embodiment shown in FIG. 10.

The lighting device may further include an insulation sheet 832 and a reflecting sheet 834 provided under the light emitting module 830, to electrically protect the light emitting module 830, and the optical member may be disposed on a traveling path of the light irradiated by the light emitting module 830 to perform various optical functions.

The reflector 840 may be formed in a circular truncated cone shape, with being coupled to the lower end of the heat sink 820, and it may reflect the light irradiated from the light emitting module 830. The cover cap 850 may have a circular ring shape, with being coupled to a lower end of the reflector 140. The lens part 860 may be insertedly coupled to the cover cap 850. The lighting device shown in FIG. 10 may be embedded in a ceiling or wall of a building, to be used as a downlight.

Figure 11:
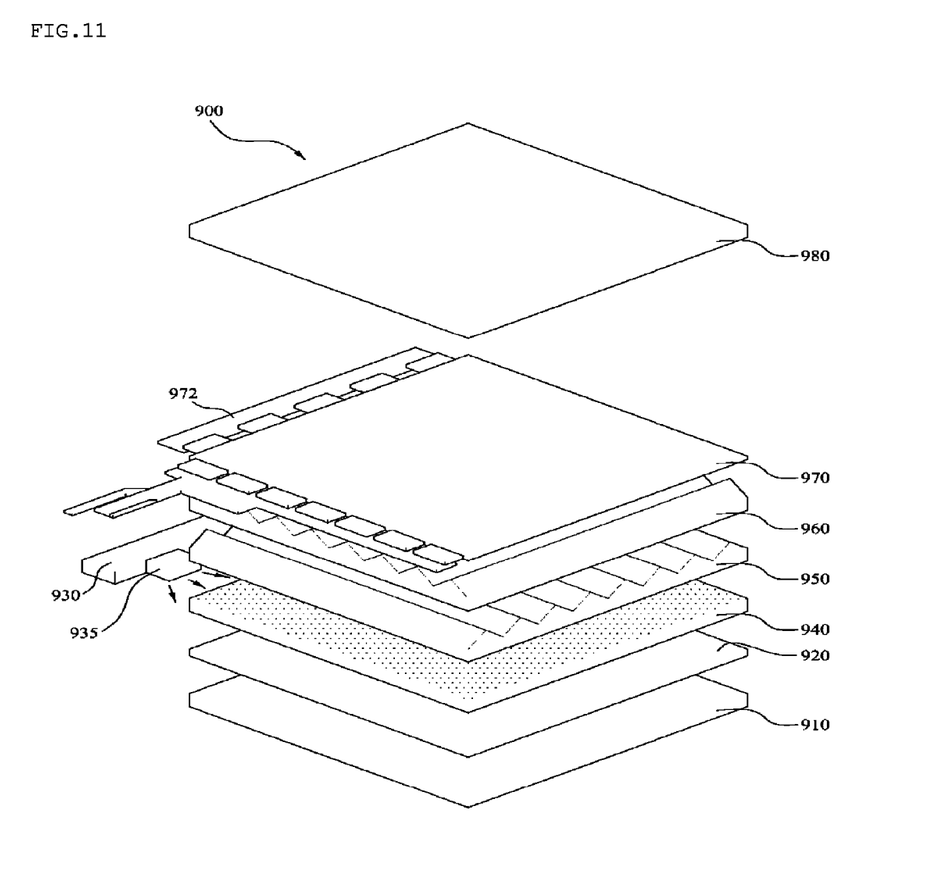
FIG. 11 illustrates a display device according to an embodiment.

FIG. 11 illustrates a display device according to an embodiment, which includes the light emitting device package according to the embodiment. In reference to FIG. 11, the display device 900 according the embodiment may include a bottom cover 910, a reflection plate 920 disposed on the bottom cover 910, a light source module 930 and 935 configured to emit light, a light guide plate 940 disposed in front of the reflection plate 920 to guide the light emitting from the light source module 930 and 935 toward a front of the display device, an optical sheet including prism sheets 950 and 960 disposed in front of the light guide plate 940, a display panel disposed in from the optical sheet, an image signal output circuit 972 connected to the display panel 970 to supply an image signal to the display panel 970, and a color filter 980 disposed in front of the display panel 970. Here, the bottom cover 910, the reflection plate 920, the light source module 930 and 935, the light guide plate 940 and the optical sheet may compose a backlight unit.

The light source module may include a substrate 930 and a light emitting device packages 935 having the light emitting device 100 or 200 according to the embodiments described above. Here, a PCB may be used as the circuit board 930.

The bottom cover 910 may accommodate elements provided in the image display device 900. The reflection plate 920 may be provided as a separate element as shown in the drawing or it may be provided by coating a rear surface of the light guide panel 940 or a front surface of the bottom cover 910 with a material having a high reflectivity.

Here, the reflection plate 920 may be formed of a material having a high reflectivity that is useable in an ultra-thin type such as polyethylene terephthalate (PET).

The light guide panel 940 may scatter the light emitted from the light emitting device package module, to uniformly distribute the light throughout an entire screen of the liquid crystal display device. As a result, the light guide panel 940 may be formed of a material having a high index of refraction and a high transmissivity such as polymethylemethacrylate (PMMA), polycarbonate (PC) or polyethylene (PE).

The first prism sheet 950 may be formed of a light transmissive polymer with translucency and elasticity provided on a surface of a support film. The polymer may have a prism layer having a plurality of three-dimensional structures formed thereon repeatedly. Here, the plurality of the patterns may be formed in a strip type having crests and troughs repeated therein.

The direction of crests and troughs formed on a surface of a support film of the second prism sheet 960 may be perpendicular to the direction of the crests and troughs formed in a surface of the support film of the first prism sheet 950. This may serve to uniformly distribute the light transmitted from the light source module and the reflective plate 920 in all directions of the panel 970.

Although not shown in the drawing, a protection sheet may be provided on each of the prism sheets and a protecting layer having a light dispersion particle and a binder provided on both surfaces of the support film. The prism layer may be formed of a copolymer material selected from a group consisting of polyurethane, styrene-butadiene copolymer, polycrylate, polymethacrylate, polymethyl methacrylate, polyethylene terephthalate elastomer, polyisoprene and polysilicon.

Although not shown in the drawing, a diffusion sheet may be disposed between the light guide plate 940 and the first prism sheet 950. The diffusion sheet may be formed of a polyester-and-polycarbonate-based material and a light projection angle may be widened by refraction and scattering of the light incident from the backlight unit. The diffusion sheet may include a supporting layer having a light diffusing agent and first and second layers formed on a light emitting surface (toward the first prism sheet) and light incident surface (toward the reflecting sheet), with no light diffusing agent.

According to the embodiment, the diffusion sheet, the first prism sheet 950 and the second prism sheet 960 may compose an optical sheet. The optical sheet may be configured of another combination, for example, of a combination of micro-lens arrays or a combination of a single prism sheet and a micro-lens array. The display panel 970 may be a liquid crystal display.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or dispositions of the subject combination disposition within the scope of the disclosure, the drawings and the appended claims. In addition to variations and modifications in the component parts and/or dispositions, alternative uses will also be apparent to those skilled in the art.

What is claimed is:

1. A light emitting device comprising:
   a light transmissive substrate;
   a light emitting structure disposed on the light transmissive substrate, comprising a first conductive type semiconductor layer, an active layer and a second conductive type semiconductor layer;
   a conductive layer disposed on the second conductive type semiconductor layer;
   a first electrode part disposed on the conductive layer, wherein the first electrode part comprises a first pad part, a first expanded part being expanded from the first pad part, and a plurality of first contact electrodes connected to the first expanded part, wherein the first electrode part is in contact with the first conductive type semiconductor layer, and wherein the plurality of first contact electrodes pass through the conductive layer, the second conductive type semiconductor layer and the active layer and the plurality of the first contact electrodes are spaced apart from each other; and
   a first insulation layer disposed between the conductive layer and the first electrode part, between the second conductive type semiconductor layer and the first electrode part and between the active layer and the first electrode part,
   wherein the distances between two neighboring ones of the first contact electrodes are increasing as they are getting more distant from the first pad part.

2. The light emitting device according to claim 1, further comprising:
   a second electrode part disposed on the conductive layer.

3. A light emitting device comprising:
   a substrate;
   a light emitting structure disposed on the substrate, comprising a first conductive type semiconductor layer, an active layer and a second conductive type semiconductor layer;
   a conductive layer disposed on the second conductive type semiconductor layer;
   a first electrode part disposed on the conductive layer, wherein the first electrode part comprises a first pad part, a first expanded part being expanded from the first pad part, and a plurality of first contact electrodes connected to the first expanded part, wherein the first electrode part is in contact with the first conductive type semiconductor layer, and wherein the plurality of first contact electrodes pass through the conductive layer, the second conductive type semiconductor layer and the active layer and the plurality of the first contact electrodes are spaced apart from each other;
   a first insulation layer disposed between the conductive layer and the first electrode part, between the second conductive type semiconductor layer and the first electrode part and between the active layer and the first electrode part;
   a second electrode part disposed on the conductive layer; and
   a second insulation layer disposed between the conductive layer and the second electrode part, wherein at least a predetermined region of the second electrode part is in contact with the conductive layer, passing through the second insulation layer, and wherein the distances between two neighboring ones of the first contact electrodes are increasing as they are getting more distant from the first pad part.

4. The light emitting device according to claim 3, wherein the second electrode part comprises,
a second pad part disposed on the second insulation layer;
a second expanded part disposed on the second insulation layer, with being expanded from the second pad part; and
at least one second contact electrode connected to the second expanded part, in contact with the conductive layer, passing through the second insulation layer.

5. The light emitting device according to claim 3, further comprising:
a current blocking layer disposed between the second conductive type semiconductor layer and the conductive layer, with at least predetermined region overlapped with the second electrode part.

6. The light emitting device according to claim 4, wherein a plurality of second contact electrodes are provided and the plurality of the second contact electrodes are spaced apart a predetermined distance from each other.

7. The light emitting device according to claim 6, wherein the distances between each two neighboring ones of the second contact electrodes are uniform.

8. The light emitting device according to claim 6, wherein the distances between two neighboring ones of the second contact electrodes are increasing as they are getting more distant from the second pad part.

9. The light emitting device according to claim 6, wherein the first contact electrode is aligned between two neighboring ones of the second contact electrodes.

10. The light emitting device according to claim 6, wherein a center of the first contact electrode is aligned at a middle point between two neighboring ones of the second contact electrodes.

11. The light emitting device according to claim 6, wherein the second expanded part includes a first branched finger electrode and a second branched finger electrode which are expanded from the second pad part along different directions, respectively, and the second contact electrodes connected to the first branched finger electrode and the second contact electrodes connected to the second branched finger electrode are disposed symmetrically.

12. A backlight unit comprising:
a bottom cover;
a reflecting plate disposed on the bottom cover;
a light source module comprising at least one light emitting device;
a light guide plate disposed in front of the reflecting plate, to guide light emitted from the light source module;
an optical sheet disposed in front of the light guide plate; and
a display panel disposed in front of the optical sheet,
wherein the light emitting device comprises,
a substrate;
a light emitting structure disposed on the substrate, comprising a first conductive type semiconductor layer, an active layer and a second conductive type semiconductor layer;
a conductive layer disposed on the second conductive type semiconductor layer;
a first electrode part disposed on the conductive layer, wherein the first electrode part comprises a first pad part, a first expanded part being expanded from the first pad part, and a plurality of first contact electrodes connected to the first expanded part, wherein the first electrode part is in contact with the first conductive type semiconductor layer, and wherein the plurality of first contact electrodes pass through the conductive layer, the second conductive type semiconductor layer and the active layer and the plurality of the first contact electrodes are spaced apart from each other;
a first insulation layer disposed between the conductive layer and the first electrode part, between the second conductive type semiconductor layer and the first electrode part and between the active layer and the first electrode part;
a second electrode part disposed on the conductive layer; and
a second insulation layer disposed between the conductive layer and the second electrode part, and
wherein at least a predetermined region of the second electrode part is in contact with the conductive layer, passing through the second insulation layer, and
wherein the distances between two neighboring ones of the first contact electrodes are increasing as they are getting more distant from the first pad part.

* * * * *